(12) United States Patent
Spasov

(10) Patent No.: US 11,520,586 B2
(45) Date of Patent: Dec. 6, 2022

(54) METHOD AND APPARATUS FOR RENAMING SOURCE OPERANDS OF INSTRUCTIONS

(71) Applicant: Dejan Spasov, Skopje (MK)

(72) Inventor: Dejan Spasov, Skopje (MK)

(*) Notice: Subject to any disclaimer, the term of this patent is extended or adjusted under 35 U.S.C. 154(b) by 112 days.

(21) Appl. No.: 17/370,098

(22) Filed: Jul. 8, 2021

(65) Prior Publication Data

US 2021/0334104 A1 Oct. 28, 2021

Related U.S. Application Data

(63) Continuation-in-part of application No. 16/537,633, filed on Aug. 12, 2019.

(60) Provisional application No. 62/856,749, filed on Jun. 4, 2019.

(51) Int. Cl.
*G06F 9/30* (2018.01)
*H03K 19/173* (2006.01)
*G06F 9/38* (2018.01)

(52) U.S. Cl.
CPC ...... *G06F 9/30145* (2013.01); *G06F 9/30101* (2013.01); *G06F 9/3802* (2013.01); *G06F 9/3863* (2013.01); *H03K 19/1737* (2013.01)

(58) Field of Classification Search
CPC .. G06F 9/384; G06F 9/30145; G06F 9/30101; G06F 9/3802
See application file for complete search history.

(56) References Cited

U.S. PATENT DOCUMENTS

| 4,992,938 | A | 2/1991 | Cocke et al. |
| 5,499,352 | A | 3/1996 | Clift et al. |
| 5,524,262 | A | 6/1996 | Colwell et al. |
| 7,272,701 | B2 | 9/2007 | Sodani |
| 2014/0108772 | A1 | 4/2014 | Gschwind |

OTHER PUBLICATIONS

Yeager; Kenneth C. "The Mips R10000 Superscalar Microprocessor," IEEE Micro 16(2):28-40, Apr. 1996.
Safi; Elham et al. Two-Stage, Pipelined Register Renaming, IEEE Transactions on Very Large Scale Integration (VLSI) Systems, vol. 19, Issue: 10, Oct. 2011.

*Primary Examiner* — Corey S Faherty

(57) ABSTRACT

A renaming unit configured to rename source operands of instructions in a group. A renaming register maintains architectural to physical register mappings. Architectural to physical register mappings propagate from the renaming register through a chain of update units (U) over bus lines denoted with the architectural registers 0 to L. Update units (U) sequentially, in program order, insert physical register identifiers PR(i) allocated to instructions I(i) with destination operands DOP(i) on bus lines denoted with the destination operands DOP(i). Source operands of an instruction I(i) may be renamed to physical register identifiers after physical register identifiers allocated to instructions older than I(i) are sequentially, in program order, inserted on the bus lines, but before physical register identifiers allocated to I(i) and younger instructions are inserted on the bus lines. A source operand SOP(i) is renamed to a physical register identifier that propagates on a bus line denoted with SOP(i).

20 Claims, 6 Drawing Sheets

METHOD AND APPARATUS FOR RENAMING SOURCE OPERANDS OF INSTRUCTIONS

RELATED APPLICATIONS

This application is a Continuation in part of Ser. No. 16/537,633 filed on Aug. 12, 2019, which claims priority to Provisional Application 62/856,749 filed on Jun. 4, 2019.

BACKGROUND

Field of the Invention

The present invention relates to microprocessors, and more particularly, to efficiently perform register renaming.

Description of the Related Art

A processor may include a renaming unit where source operands of instructions are renamed to physical register identifiers. Source and destination operands are architectural registers, such that source operands of instructions consumers of a result are equal to the destination operand of the instruction producer of the result. The processor may include a plurality of physical registers organized in one or more physical register files. Each physical register is identified with a physical register identifier—an integer in the interval from 0 to N. For each instruction with destination operand the renaming unit may be configured to allocate (or assign) a physical register identifier to point to a physical register where the result of the execution of the instruction may be stored. Most recently allocated physical register identifiers may be organized in a structure known as architectural to physical register mappings.

In one embodiment, architectural to physical register mappings may be stored in a register alias table (RAT). The RAT comprises a plurality of entries indexed with the architectural registers. Each entry is configured to store a physical register identifier most recently allocated to an instruction with destination operand equal to the index of the entry. Source operands of an instruction are renamed to physical register identifiers from the RAT at indexes provided by the source operands. After source operands of an instruction are renamed, physical register identifier allocated to the instruction is stored in the RAT at index provided by the destination operand of the instruction. Reading from the RAT and writing to the RAT is performed sequentially, in program order of the instructions, which makes the renaming process prohibitively slow.

In another embodiment, the renaming unit may be configured to simultaneously rename source operands in a group of instructions. The RAT may be configured to store architectural to physical register mappings from prior groups of instructions. The renaming unit is configured to compare a source operand of an instruction with destination operands of older instructions in the group and to output physical register identifier allocated to the youngest instruction with destination operand equal to the source operand. If no match is found, the renaming unit is configured to read the RAT and to output physical register identifier at index identified with the source operand. For a group of n instructions, the RAT is read in parallel, at indexes provided by the source operands. The RAT may be implemented as multi-ported SRAM with 2n read ports and n write ports. Hardware complexity of the RAT increases quadratically with respect to the number of ports. The renaming unit may include n×(n−1) comparators to compare each source operand with destination operands of older instructions. Hence, die area, wiring complexity, and power consumption of the renaming unit depend quadratically on the size n of the group of instructions. In multithreaded microarchitectures, said hardware complexity may have to be multiplied with the number of threads. Reading the RAT and comparing source with destination operands is performed in parallel, for each source operand in the group, which makes the renaming process excessively complex.

SUMMARY

Method and apparatus for renaming source operands in a group of instructions are contemplated. The hardware complexity of embodiments described herein depends linearly on the size of the instruction group.

A physical register identifier from a list of free physical register identifiers is allocated (or assigned) to each instruction with destination operand. Instructions' source and destination operands are architectural registers selected from a plurality of architectural registers. A renaming register stores architectural to physical register mappings from prior groups of instructions. The renaming register comprises a plurality of fields that may be considered denoted with the architectural registers. A field denoted with an architectural register stores a physical register identifier most recently allocated to an instruction from a prior group with destination operand equal to the architectural register. Physical register identifiers from the renaming register propagate on a plurality of bus lines that may be considered denoted with the architectural registers. Physical register identifiers allocated to instructions in the group are sequentially, in program order, inserted on bus lines denoted with the destination operands. A bus line denoted with an architectural register propagates a physical register identifier most recently allocated to instruction with a destination operand equal to the architectural register.

Source operands of the oldest instruction in the group may be renamed to physical register identifiers stored in the renaming register at fields denoted with the source operands. Source operands of an instruction, other than the oldest, may be renamed to physical register identifiers after physical register identifiers allocated to instructions older than the instruction are sequentially, in program order, inserted on the bus lines, but before physical register identifiers allocated to the instruction and younger instructions are inserted on the bus lines. A source operand is renamed to a physical register identifier most recently inserted on a bus line denoted with the source operand.

DETAILED DESCRIPTION

Figure 1:
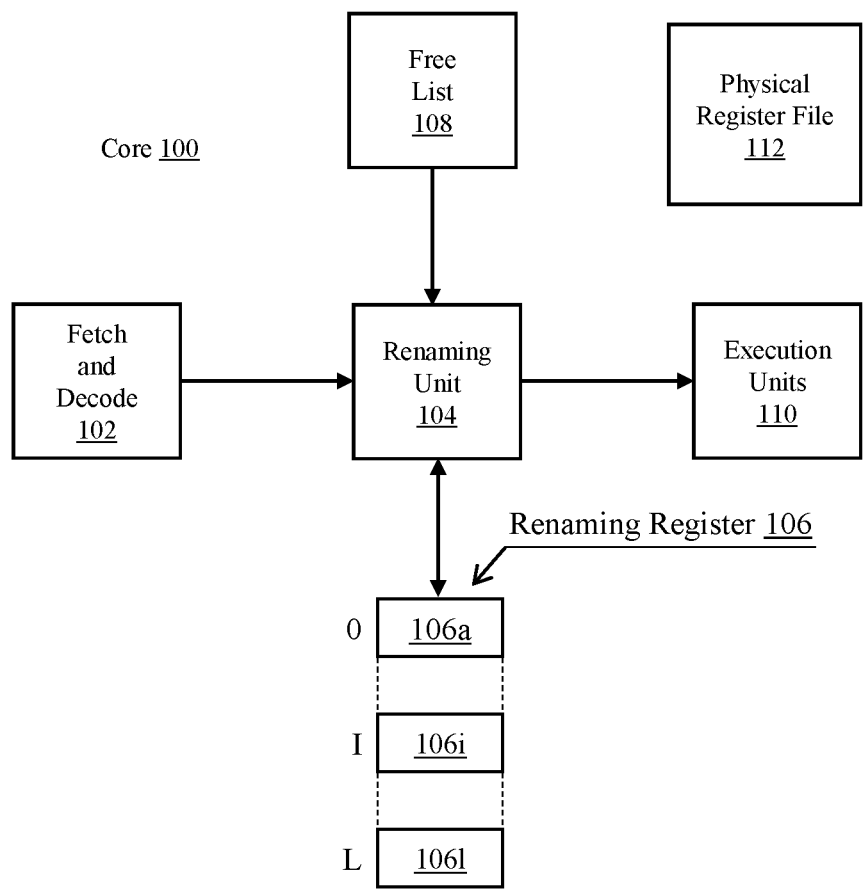
FIG. 1 shows an embodiment of a processor core.

FIG. 1 shows the microarchitecture of a core processor. The core 100 may include fetch and decode unit 102, renaming unit 104, renaming register 106, free list 108, execution units 110, physical register file 112, and other components and interfaces not shown on FIG. 1 to emphasize embodiments described herein. The core 100 may support multiple instruction issue and out-of-order execution of instructions. In one embodiment, the core 100 may support multi-threading such that the plurality of threads may simultaneously be processed, or the plurality of threads may time-share the core 100, or combination thereof.

The fetch and decode unit 102 may be configured to fetch instructions from memory or cache and to output, in parallel, one or more decoded instructions or instruction (micro-) operations. The fetch and decode unit 102 may be configured to fetch instructions from any instruction set architecture, e.g. PowerPC™, ARM™, SPARC™, x86™, etc., and to output instructions that may be executed in the execution units 110. In other embodiments, the fetch and decode unit 102 unit may be represented with two or more separate units e.g., fetch unit, decode unit, branch predictor, L1 cache, etc.—not shown on FIG. 1 to emphasize embodiments described herein.

Instructions comprise source and destination operands. Source and destination operands are architectural registers selected from the plurality of architectural registers 0, 1, . . . , L, such that source operands of instructions consumers of a result are equal to the destination operand of the instruction producer of the result. Architectural registers are integers in the interval from 0 to L. The core 100 may include a plurality of physical registers organized in one or more physical register files 112. Physical registers of the core 100 may be configured to store speculative results and architecturally visible results. Physical registers of the core 100 may be identified (or addressed) with physical register identifiers. A physical register identifier is an integer that identifies (or points to) a physical register in the one or more physical register files 112. For each instruction with destination operand the core 100 may be configured to allocate physical register where the instruction will store the result of execution. The free list 108 is a list of physical register identifiers that identify physical registers that may be allocated to instructions with destination operands. For each instruction with destination operand, the free list 108 is configured to output physical register identifier that points to the physical register allocated to the instruction. Outputted physical register identifier is referred to as "allocated physical register identifier" or "physical register identifier allocated to an instruction" to highlight the origin and the role of the physical register identifier.

The fetch and decode unit 102 may be configured to output a group of instructions. The renaming unit 104 is configured to rename (map) source operands of instructions consumers of a result to the physical register identifier allocated to the instruction producer of the result. A source operand of an instruction is renamed to a physical register identifier most recently allocated to instruction with destination operand equal to the source operand. Most recently allocated physical register identifiers may be organized in a structure known as architectural to physical register mappings. For an instruction, architectural to physical register mappings is a set of physical register identifiers with one-to-one correspondence to the architectural registers such that a physical register identifier that corresponds to an architectural register I is allocated to the youngest instruction, older than said instruction, with destination operand equal to I. A source operand of an instruction may be renamed to a physical register identifier from the architectural to physical register mappings that one-to-one corresponds to the source operand.

The renaming register 106 is configured to store physical register identifiers comprising architectural to physical register mappings from prior groups of instructions. The renaming register 106 may include one field per architectural register 0, . . . , L 106*a*-1, where physical register identifiers are stored. A physical register identifier stored in a field I 106*i* is allocated to the youngest instruction from a prior group with destination operand equal to I. Content-wise the renaming register 106 is identical to the register alias table (RAT). However, RAT is operated as SRAM with a plurality of read ports and a plurality of (priority) write ports, while the renaming register 106 may be operated as SRAM with one read port and one write port. In one embodiment, in a multi-threaded core 100, the renaming register 106 may be configured to store architectural to physical register mappings that belong to instructions from one thread. In another embodiment, in a multi-threaded core 100, the renaming register 106 may include one field per architectural register per thread to store architectural to physical register mappings for each thread.

The renaming register 106 may be coupled to the to the renaming unit 104 with a plurality of bus lines denoted with the architectural registers to provide architectural to physical register mappings. The renaming unit 104 sequentially, in program order, inserts physical register identifiers allocated to instructions in the group on bus lines denoted with the destination operands of the instructions. The renaming unit 104 is configured to insert a physical register identifier allocated to an instruction in the group on a bus line denoted with the destination operand of the instruction. The renaming unit 104 may be coupled to the renaming register 106 to store an updated set of physical register identifiers.

Source operands of the oldest instruction in the group may be renamed to physical register identifiers stored in the renaming register 106 at fields denoted with the source operands. Source operands of an instruction, other than the oldest, may be renamed to physical register identifiers after physical register identifiers allocated to instructions older than the instruction are sequentially, in program order, inserted on the bus lines, but before physical register identifiers allocated to the instruction and younger instructions are inserted on the bus lines. A source operand may be renamed to a physical register identifier most recently inserted on a bus line denoted with the source operand.

Instructions with renamed operands are provided to the execution units 110. Execution units 110 may include any number and type of execution units, e.g. integer unit, floating-point unit, load/store unit, branch unit, etc., configured to execute instructions. Instructions may be executed out-of-order. The core 100 may include hardware to maintain in-order retirement of the instructions. The core 100 may include one or more reservation stations to host instructions waiting to be issued to the execution units 110.

Figure 2:
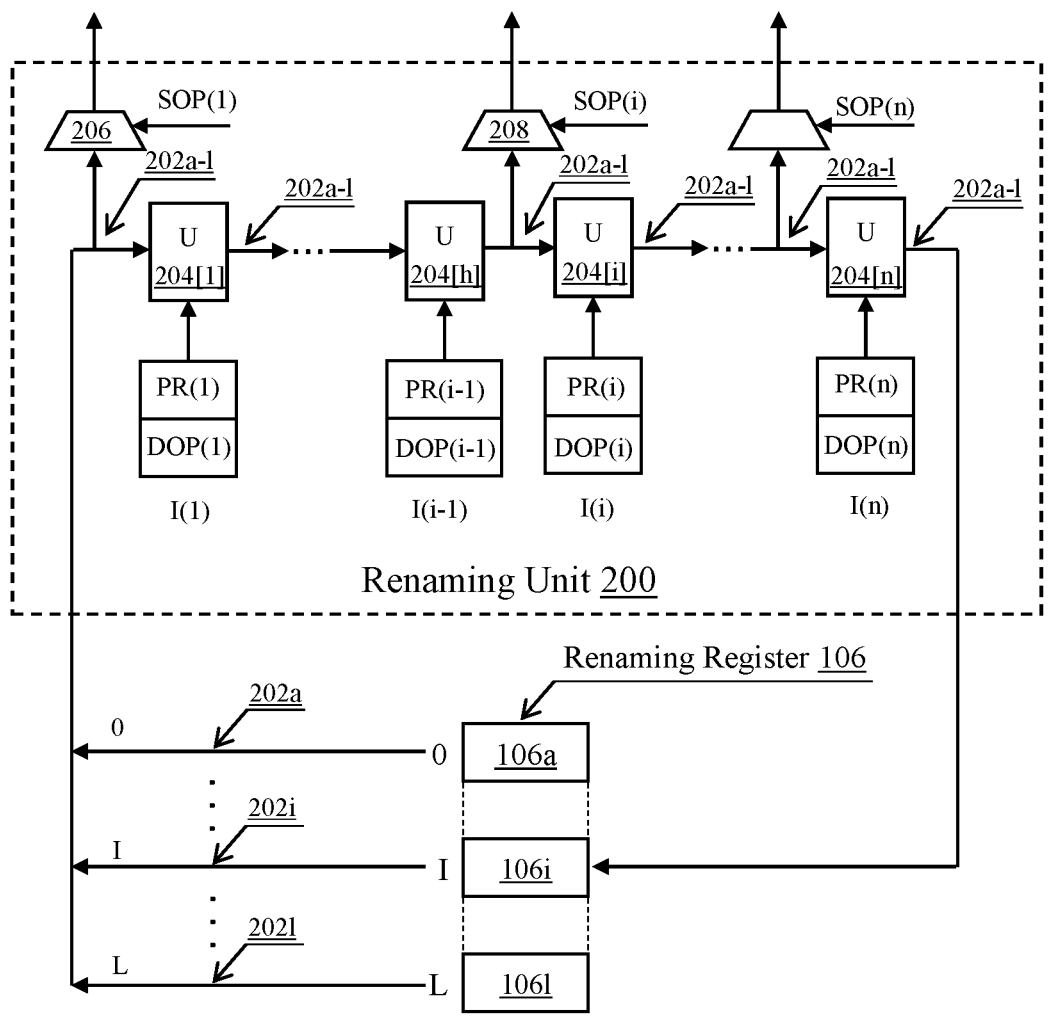
FIG. 2 shows an embodiment of a renaming unit.

Referring now to FIG. 2, an embodiment of a renaming unit is shown. The renaming unit 200 is configured to rename source operands of instructions in a group of n instructions I(1), I(2), . . . , I(n). Each instruction I(i), i=1, 2, . . . , n, may include a source operand SOP(i), a destination operand DOP(i), and a physical register identifier PR(i) allocated to I(i). Instructions may be considered to be in program order, where each instruction I(i), i=1, 2, . . . , n−1, is older than its successor I(i+1).

The renaming unit 200 comprises a chain of n update units (U) 204[1]44 Physical register identifiers propagate from the renaming register 106 through the chain of update units 204[1]-[n] over bus lines denoted with 0, . . . , L 202a-1. A bus line denoted with I 202i may be considered to propagate a physical register identifier allocated to instruction with destination operand I. The first update unit 204[1], coupled to the renaming register 106, is configured to output PR(1) on a bus line denoted with DOP(1). A second update unit 204[2] (not shown), coupled to the first update unit 204[1], is configured to output PR(2) on a bus line denoted with DOP(2), etc. Update unit 204[1], coupled to the preceding update unit 204[h], is configured to output PR(i) on a bus line denoted with DOP(i). The chain of update units 204 [1]-[n] sequentially, in program order, outputs physical register identifiers PR(1), PR(2), . . . , PR(n) allocated to instructions I(1), I(2), . . . , I(n) on bus lines 202a-1 denoted with DOP(1), DOP(2), . . . , DOP(n), respectively.

Update units U 204[1]-[n] update architectural to physical register mappings from the renaming register 106. Update unit 204[1] outputs architectural to physical register mappings with respect to the instruction I(2). Update unit 204[h] outputs architectural to physical register mappings with respect to the instruction I(i). Update unit 204[1] outputs architectural to physical register mappings with respect to the instruction I(i+1). The last update unit 204[n] outputs architectural to physical register mappings for the next group of instructions. The last update unit 204[n] may be coupled to the renaming register 106 to store physical register identifiers comprising architectural to physical register mappings for the next group of instructions.

In one embodiment, in a multi-threaded core 100, update units 204[1]-[n] may be configured to output physical register identifiers that are allocated to instructions from one thread. The renaming unit 200 may include one bus line per thread per architectural register or one bus line per architectural register that may be time-shared by the plurality of threads. In one embodiment, the renaming unit 200 may include a plurality of chains as 204[1]-[n], wherein each chain may be configured to maintain architectural to physical register mappings for instructions from one thread. In another embodiment, the chain of update units 204[1]-[n] may be time-shared by the plurality of threads.

Source operands of the oldest instruction I(1) may be renamed to physical register identifiers from the physical register identifiers stored in the renaming register 106. A multiplexer 206 may be coupled to the renaming register 106. A source operand SOP(1) of the oldest instruction I(1) may be coupled as selection control to the multiplexer 206. The multiplexer 206 may be configured to output a physical register identifier from a field denoted with SOP(1); thus, renaming the source operand SOP(1) to a physical register identifier.

Source operands of instruction I(i), i=2, 3, . . . , n, may be renamed to physical register identifiers after physical register identifiers PR(1), PR(2), . . . , PR(i−1) allocated to instructions older than I(i) are inserted on the bus lines 202a-1, but before physical register identifiers PR(i), PR(i+1), PR(n) allocated to I(i) and younger instructions are inserted on the bus lines 202a-1. The sub-chain of update units 204[1]-[h] sequentially, in program order, inserts physical register identifiers PR(1), PR(2), . . . , PR(i−1) on the bus lines 202a-1. Hence, source operands of I(i) may be renamed to physical register identifiers outputted from the update unit 204[h]. A multiplexer 208 may be coupled to the output of the update unit 204[h]. A source operand SOP(i) of I(i) may be coupled as selection control to the multiplexer 208. The multiplexer 208 may be configured to output a physical register identifier from a bus line denoted with SOP(i); thus, renaming the source operand SOP(i) to a physical register identifier.

Figure 3:
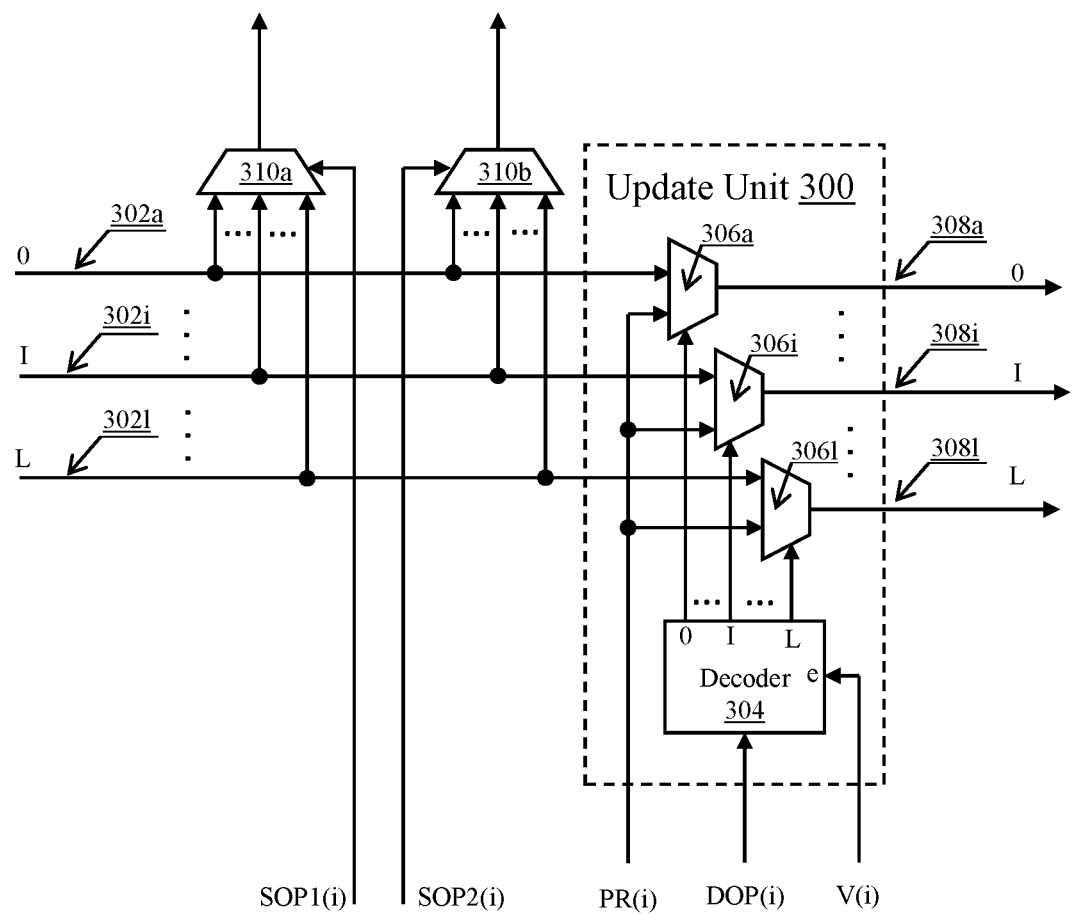
FIG. 3 shows an embodiment of an update unit.

Turning now to FIG. 3, an embodiment of an update unit is shown. The update unit 300 is coupled to receive physical register identifiers on the bus lines 0, . . . , L 302a-1. A bus line denoted with I 302i is coupled to provide a physical register identifier allocated to instruction with destination operand I. The update unit 300 is coupled to receive allocated physical register identifier PR(i), destination operand DOP(i), and a valid signal V(i) of instruction I(i), i=1, 2, . . . , n. The valid signal V(i) indicates if I(i) is valid instruction with destination operand e.g. if I(i) writes to a destination operand. In one embodiment, the update unit 300 may be configured to rename instructions that belong to one thread in a group of instructions. Instructions that belong to this thread may be considered valid instructions. Instructions from other threads may be considered invalid instructions. If V(i) indicates invalid instruction, the update unit 300 is configured to output received physical register identifiers 302a-1 on the bus lines 0, . . . , L 308a-1. A bus line denoted with I 308i is configured to output a physical register identifier allocated to instruction with destination operand I. If V(i) indicates that I(i) is valid instruction with destination operand, the update unit 300 is configured output PR(i) on a bus line denoted with DOP(i) while remaining bus lines 308a-1 output physical register identifiers received from the corresponding bus lines 302a-1.

The update unit 300 comprises a decoder 304 and plurality 2-to-1 multiplexers 306a-1. Those of ordinary skill in the art will appreciate that the hardware may vary depending on the implementation. Each multiplexer 306a-1 is coupled to receive PR(i) and one of the bus lines 302a-1. The decoder 304 is coupled to receive DOP(i) on the input and V(i) on the enable input. Output signal lines from the decoder 304, denoted with 0, . . . , L, are coupled as selection control to the multiplexers 306a-1. An output signal line I may be coupled as selection control to a multiplexer 306i, which is coupled to a bus line I 302i. The decoder 304 is configured to assert the output signal line I if DOP(i)=I and if V(i) indicates that I(i) is valid instruction with destination operand. If the output signal line I is asserted, the multiplexer 306i is configured to output PR(i) on the bus line I 308i. If the output signal line I is deasserted, the multiplexer 306i is configured to output the physical register identifier received on the bus line I 302i.

Multiplexers 310a-b may be coupled to the bus lines 302a-1 to rename source operands SOP1(i) and SOP2(i) of the instruction I(i). Source operands SOP1(i) and SOP2(i) are coupled as selection control to the multiplexers 310a-b. Multiplexers 310a-b are configured to output physical register identifiers from the bus lines 302a-1 identified with SOP1(i) and SOP2(i), respectively. Thus, source operands SOP1(i) and SOP2(i) are renamed to physical register identifiers.

Figure 4:
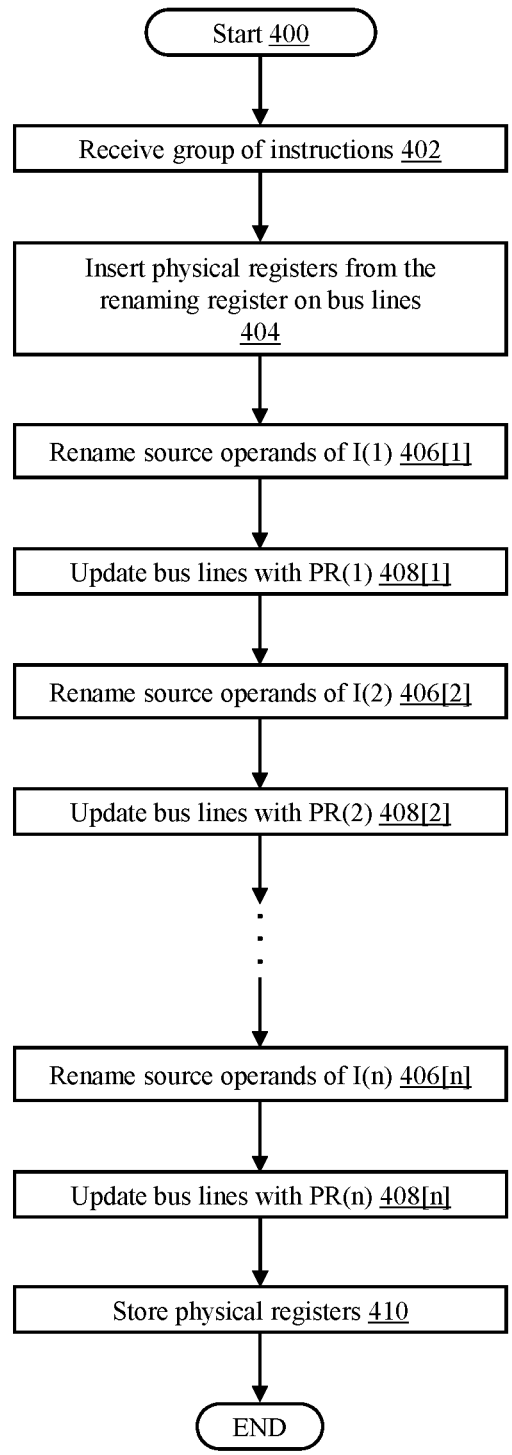
FIG. 4 shows a method for renaming source operands of an instruction.

Turning now to FIG. 4, a method for renaming source operands is shown. A group of instructions I(1), I(2), . . . , I(n) is received for renaming (block 402). Each instruction I(i), i=1, 2, . . . , n, may include one or more source operands SOP(i), destination operand DOP(i), and physical register identifier PR(i) allocated to the instruction. A renaming register comprising a plurality of fields is maintained. A field of the renaming register is configured to store a physical register identifier allocated to instruction with destination operand equal to a predefined architectural register. Physical register identifiers from the renaming register are inserted on a plurality of bus lines denoted with the architectural registers (block 404). A bus line denoted with I propagates a physical register identifier allocated to instruction with destination operand I.

Source operands of the first instruction I(1) are renamed to physical register identifiers by reading the bus lines coupled to the fields of the renaming register. Source operands of I(1) are renamed to physical register identifiers that propagate on bus lines denoted with the source operands (block 406[1]). If I(1) includes destination operand DOP(1), physical register identifier PR(1) allocated to I(1) is inserted on a bus line denoted with DOP(1) (block 408[1]).

Source operands of the next instruction I(2) are renamed to physical register identifiers that propagate on bus lines denoted with the source operands (block 406[2]). A source operand SOP(2) of I(2) is renamed to physical register identifier allocated to youngest instruction, older than I(2), with destination operand equal to SOP(2). If I(2) includes destination operand DOP(2), physical register identifier PR(2) allocated to I(2) is inserted on a bus line denoted with DOP(2) (block 408[2]).

Blocks 406 and 408 are repeated for each instruction I(i), where i=1, 2, . . . , n, in the group starting from I(1). Source operands of instruction I(i) are renamed to physical register identifiers that propagate on bus lines denoted with the source operands (blocks 406). A source operand SOP(i) of I(i) is renamed to physical register identifier allocated to youngest instruction, older than I(i), with destination operand equal to SOP(i). If I(i) includes destination operand DOP(i), physical register identifier PR(i) allocated to I(i) is inserted on a bus line denoted with DOP(i) (blocks 408).

Source operands of the last instruction I(n) are renamed to physical register identifiers that propagate on bus lines denoted with the source operands (block 406[n]). A source operand SOP(n) of I(n) is renamed to physical register identifier allocated to youngest instruction, older than I(n), with destination operand equal to SOP(n). If I(n) includes destination operand DOP(n), physical register identifier PR(n) allocated to I(n) is inserted on a bus line denoted with DOP(n) (block 408[n]). After I(n) updates the bus lines, most recently allocated physical register identifiers that propagate on the bus lines may be stored in the renaming register (block 410).

In one embodiment, in a multi-threaded core 100, the renaming register may include one field per thread per architectural register. A field may store a physical register identifier allocated to instruction from predefined thread and destination operand equal to predefined architectural register. Physical register identifiers from the renaming register are inserted on a plurality of bus lines (block 404). The plurality of bus lines may comprise one bus line per thread per architectural register or one bus line per architectural register that is time-shared by the plurality of threads. A source operand of an instruction from a thread is renamed to a physical register identifier that propagates on a bus line that corresponds to the thread and the source operands (blocks 406). If the instruction includes a destination operand, the physical register identifier allocated to the instruction is inserted on a bus line that corresponds to the thread and to the destination operand of the instruction (blocks 408). After physical register identifiers allocated to instructions in the group are inserted on the bus lines, physical register identifiers that propagate on the bus lines may be stored in the renaming register (block 410).

Figure 5:
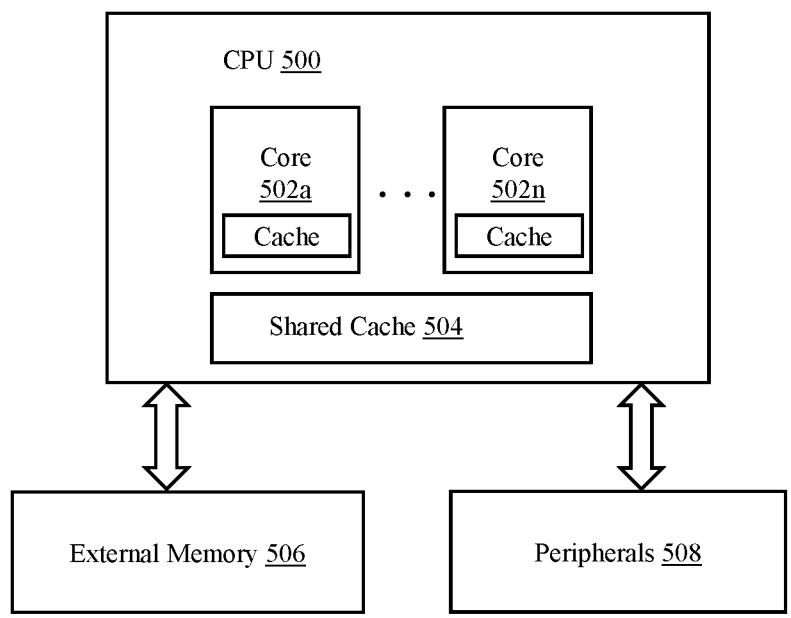
FIG. 5 shows an embodiment of central processing unit in accordance with the embodiments of the present invention.

Referring now to FIG. 5, an embodiment of a central processing unit in accordance with the embodiments of the present invention is shown. It should be obvious to those skilled in the art that the central processing unit (CPU) 500 may be embodied as hardware, software, a combination of hardware and software, or computer program product, stored on a non-transitory storage media and later used to fabricate hardware comprising the embodiments described herein. The central processing unit 500 may be part of a desktop computer, server, laptop computer, tablet computer, cell or mobile phone, wearable device, special purpose computer, etc. The central processing unit 500 may be included within a system on a chip or integrated circuit, coupled to external memory 506 and peripheral units 508. The CPU 500 may include one or more instances of core processors 502a-n, shared cache 504, interface units, power supply units, etc. At least one of the core processors 502a-n may include the embodiments described herein. External memory 506 may be any type of memory, such as dynamic random-access memory (DRAM), static random-access memory (SRAM), etc. In some systems, more than one instance of central processing units 500 and/or external memory 508 may be used on one or more integrated circuits. The peripheral unit 508 may include various types of communication interfaces, display, keyboard, etc.

Figure 6:
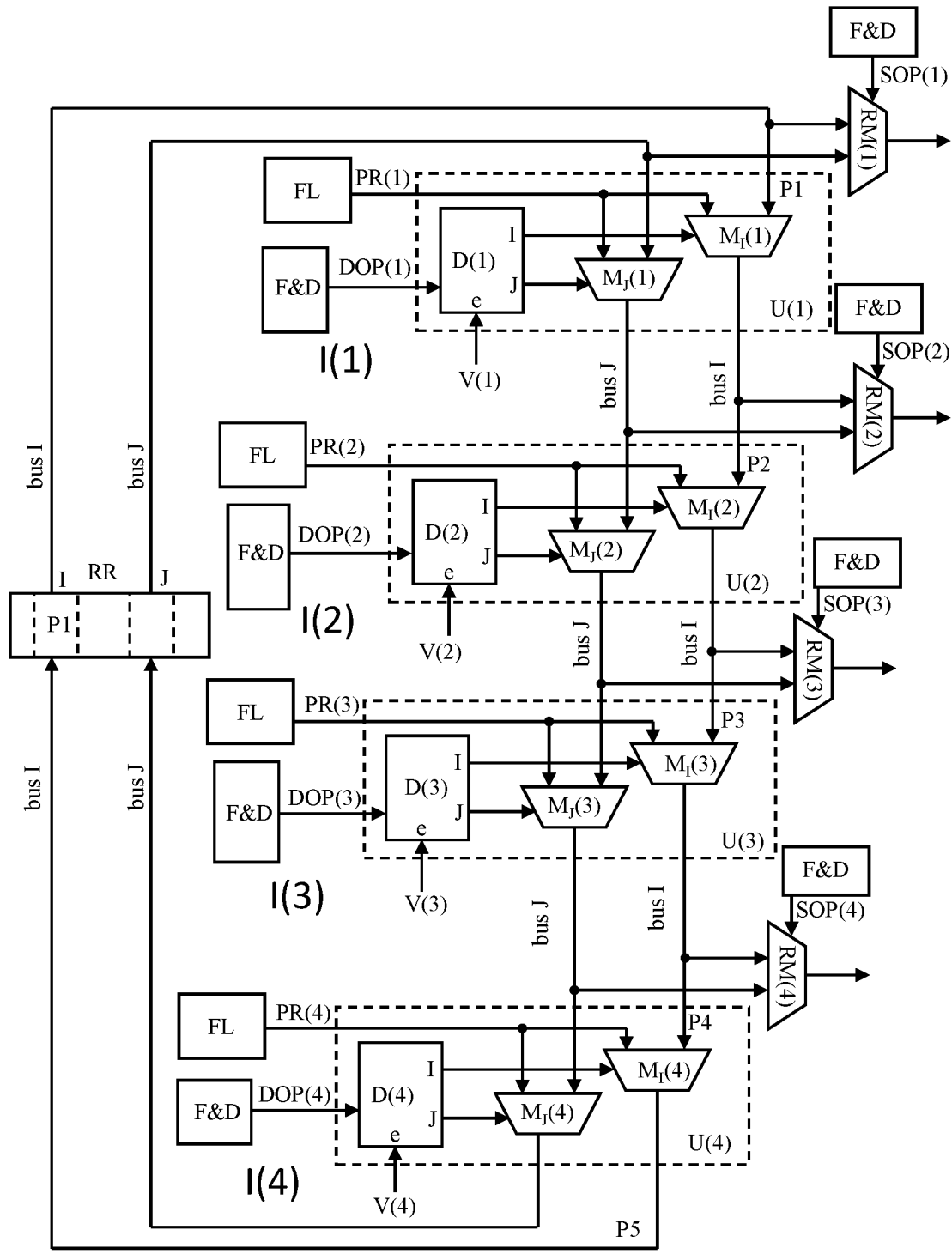
FIG. 6 shows an exemplary embodiment of the renaming unit.

Turning now to FIG. 6, an exemplary embodiment of the renaming unit is shown. The renaming unit is configured to rename 4 source operands SOP(1), SOP(2), SOP(3), and SOP(4) in a group of 4 instructions I(1), I(2), I(3), I(4). Instruction I(i), i=1, 2, 3, 4, comprises source operand SOP(i), destination operand DOP(i), allocated physical register identifier PR(i), and valid signal V(i). The valid signal V(i) indicates if I(i) is valid instruction with destination operand. The renaming register RR is configured to store architectural to physical register mappings. A field in the renaming register RR denoted with the architectural register I is configured to store physical register identifier P1 allocated to the youngest instruction from a prior group of instructions with destination operand I. The renaming unit comprises 4 update units U(1), U(2), U(3), and U(4) coupled in a chain in accordance with the embodiments on FIG. 2. The first update unit U(1) is coupled to the renaming register RR to receive architectural to physical register mappings. The last update unit U(4) is coupled to the renaming register RR to store updated architectural to physical register mappings. Different embodiments may include a different number of update units to simultaneously rename a different number of instructions. In one embodiment, a renaming unit for renaming a group of 6 instructions may include 6 update units coupled in a chain.

The principle of operation of the update units U(i), i=1, 2, 3, 4, is in accordance with the embodiments on FIG. 3. Update unit U(i) comprises a decoder D(i) and a plurality of 2-to-1 multiplexers $M_I(i)$, where I=0, . . . , L. The decoder D(i) is coupled to the fetch and decode unit F&D to receive destination operand DOP(i). A valid signal V(i) is coupled as enable to the decoder D(i). The decoder D(i) is configured to assert output signal line I, I=0, . . . , L, if V(i) indicates that I(i) is valid instruction with destination operand and the destination operand DOP(i) is equal to the architectural register I. The plurality of 2-to-1 multiplexers $M_I(i)$, I=0, . . . , L, are coupled to the free list FL to receive the allocated physical register identifier PR(i). A 2-to-1 multiplexer $M_I(i)$ is configured to output PR(i) if I(i) is valid instruction (as indicated by V(i)) with destination operand DOP(i)=I.

The chain of the 4 update units U(1), U(2), U(3), U(4) is coupled such that one 2-to-1 multiplexer from U(1) is coupled to one 2-to-1 multiplexer from U(2), which is coupled to one 2-to-1 multiplexer from U(3), which is coupled to one 2-to-1 multiplexer from U(4). It may be observed that the renaming unit includes a plurality of parallel chains of 2-to-1 multiplexers, which are coupled to the renaming register RR. Each chain of 2-to-1 multiplexers is coupled to receive a physical register identifier from a field of the renaming register RR and to write an updated physical register identifier in the same field. FIG. 6 shows two such chains: the first chain includes multiplexers $M_f(1)$, $M_f(2)$, $M_f(3)$, and $M_f(4)$, and the second chain includes multiplexers $M_f(1)$, $M_f(2)$, $M_f(3)$, and $M_f(4)$.

The first chain of multiplexers is coupled to the renaming register RR to receive physical register identifier P1 stored in the field I. Multiplexers $M_f(1)$, $M_f(2)$, $M_f(3)$, and $M_f(4)$ are configured to output allocated physical register PR(i), i=1, 2, 3, 4, when destination operand DOP(i)=I. The first chain of multiplexers is configured to write an updated physical register identifier in the field I. The first 2-to-1 multiplexer $M_f(1)$ is coupled to the field I of the renaming register RR to receive physical register identifier P1. It may be observed that P1 is allocated to the youngest instruction older than I(1) with destination operand equal to I. The second 2-to-1 multiplexer $M_f(2)$ is coupled to the first 2-to-1 multiplexer $M_f(1)$ to receive identifier P2. P2 is allocated to the youngest instruction older than I(2) with destination operand I. The next 2-to-1 multiplexer $M_f(3)$ is coupled to the previous 2-to-1 multiplexer $M_f(2)$ to receive identifier P3. P3 is allocated to the youngest instruction older than I(3) with destination operand I. The next multiplexer $M_f(4)$ is coupled to the preceding multiplexer $M_f(3)$ to receive the identifier P4. P4 is allocated to the youngest instruction older than I(4) with destination operand I. The last 2-to-1 multiplexer $M_f(4)$ may be coupled to store the physical register identifier P5 in the field I. P5 is allocated to the youngest instruction with destination operand I. The first 2-to-1 multiplexer $M_f(1)$ is configured to output P1 if DOP(1)≠I or if I(1) is not a valid instruction. $M_f(2)$ is configured to output P2 if DOP(2)≠I or if I(2) is not a valid instruction. $M_f(3)$ is configured to output P3 if DOP(3)≠I or if I(3) is not a valid instruction. $M_f(4)$ is configured to output P4 if DOP(4)≠I or if I(4) is not an instruction.

The renaming unit may include a plurality of read multiplexers RM. Read multiplexers RM(i), i=1, 2, 3, 4, are coupled to the fetch and decode unit F&D to receive source operands SOP(i), respectively. RM(1) is coupled to the renaming register RR receive P1 and to output P1 if SOP(1)=I. RM(2) is coupled to $M_f(1)$ to receive P2 and to output P2 if SOP(2)=I. RM(3) is coupled to $M_f(2)$ to receive P3 and to output P3 if SOP(3)=I. RM(4) is coupled to $M_f(3)$ to receive P4 and to output P4 if SOP(4)=I. Thus, source operands SOP(i) are renamed to physical register identifiers. Those of ordinary skill in the art will observe that the renaming unit may include an arbitrary number of read multiplexers RM to rename an arbitrary number of source operands. In one embodiment, a destination operand may be provided to a read multiplexer RM as selection control to output replaced physical register identifier. Thus, DOP(i), i=1, 2, 3, 4, may be provided as selection control to RM(i) to output physical register identifier replaced by PR(i).

I claim:

1. A processor comprising:
    a fetch and decode unit configured to output a group of instructions;
    a free list configured to output a first physical register identifier of a first physical register allocated to a first instruction with a first destination operand from the group;
    a renaming register comprising a plurality of fields, wherein the plurality of fields store a plurality of physical register identifiers, wherein the plurality of physical register identifiers comprise architectural to physical register mappings, wherein a second physical register identifier from architectural to physical register mappings is stored in a first field from the plurality of fields, wherein the second physical register identifier identifies a second physical register allocated to youngest instruction from prior group of instructions with destination operand equal to a first architectural register.

2. The processor in claim 1 comprising:
    a plurality of circuits, wherein each circuit comprises a plurality of 2-to-1 multiplexers and a decoder with output signal lines coupled as selection controls to the plurality of 2-to-1 multiplexers, wherein a first circuit from the plurality of circuits comprises a first decoder and a first plurality of 2-to-1 multiplexers, wherein each 2-to-1 multiplexer from the first plurality of 2-to-1 multiplexers is coupled to receive the first physical register identifier, wherein the first decoder is coupled to receive the first destination operand, wherein a first output signal line from the first decoder is coupled as selection control to a first 2-to-1 multiplexer from the first plurality of 2-to-1 multiplexers, wherein the first output signal line is asserted if the first destination operand is equal to the first architectural register, wherein the first 2-to-1 multiplexer outputs the first physical register identifier if the first signal line is asserted.

3. The processor in claim 2, wherein one 2-to-1 multiplexer from each circuit of said plurality of circuits is coupled in a chain, wherein a second 2-to-1 multiplexer from the chain is coupled to receive the second physical register identifier, wherein the first 2-to-1 multiplexer is coupled in the chain to receive a third physical register identifier, wherein the first 2-to-1 multiplexer is configured to output the third physical register identifier if the first signal line is not asserted.

4. The processor in claim 2, wherein the first 2-to-1 multiplexer is coupled to receive the second physical register identifier, wherein the first 2-to-1 multiplexer is configured to output the second physical register identifier if the first signal line is not asserted.

5. The processor in claim 3, wherein the first field is coupled to store physical register identifier outputted from a last 2-to-1 multiplexer in the chain.

6. The processor in claim 3 comprising:
    a plurality of read multiplexers, wherein a first read multiplexer from the plurality of read multiplexers is coupled to receive a first source operand of the first instruction as selection control, wherein the first read multiplexer is coupled to receive the third physical register identifier, wherein the first read multiplexer is configured to output the third physical register identifier if the first source operand is equal to the first architectural register.

7. The processor in claim 1, wherein said instructions in the group are from one or more threads, the processor comprising:
    a plurality of circuits, wherein each circuit comprises a plurality of 2-to-1 multiplexers and a decoder with output signal lines coupled as selection controls to the plurality of 2-to-1 multiplexers, wherein a first circuit from the plurality of circuits comprises a first decoder and a first plurality of 2-to-1 multiplexers, wherein each 2-to-1 multiplexer from the first plurality of 2-to-1 multiplexers is coupled to receive the first physical register identifier, wherein the first decoder is coupled to receive the first destination operand, wherein a first output signal line from the first decoder is coupled as selection control to a first 2-to-1 multiplexer from the first plurality of 2-to-1 multiplexers, wherein the first output signal line is asserted if the first destination operand is equal to the first architectural register and the first instruction belongs to a first thread, wherein the first 2-to-1 multiplexer outputs the first physical register identifier if the first signal line is asserted.

8. The processor in claim 7, wherein one 2-to-1 multiplexer from each circuit of the plurality of circuits is coupled in a chain, wherein a second 2-to-1 multiplexer from the chain is coupled to receive the second physical register identifier, wherein the first 2-to-1 multiplexer is coupled in the chain to receive a third physical register identifier, wherein the first 2-to-1 multiplexer is configured to output the third physical register identifier if the first signal line is not asserted.

9. The processor in claim 8, wherein the first field is coupled to store physical register identifier outputted from a last 2-to-1 multiplexer in the chain.

10. The processor in claim 8 comprising:
a plurality of read multiplexers, wherein a first read multiplexer from the plurality of read multiplexers is coupled to receive a first source operand of the first instruction as selection control, wherein the first read multiplexer is coupled to receive the third physical register identifier, wherein the first read multiplexer is configured to output the third physical register identifier if the first source operand is equal to the first architectural register.

11. A processor comprising:
a fetch and decode unit configured to output a group of instructions;
a free list configured to output a first physical register identifier of a first physical register allocated to a first instruction with a first destination operand from the group;
a plurality of circuits, wherein each circuit comprises a plurality of 2-to-1 multiplexers and a decoder with output signal lines coupled as selection controls to the plurality of 2-to-1 multiplexers, wherein a first circuit from the plurality of circuits comprises a first decoder and a first plurality of 2-to-1 multiplexers, wherein each 2-to-1 multiplexer from the first plurality of 2-to-1 multiplexers is coupled to receive the first physical register identifier, wherein the first decoder is coupled to receive the first destination operand, wherein a first output signal line from the first decoder is coupled as selection control to a first 2-to-1 multiplexer from the first plurality of 2-to-1 multiplexers, wherein the first output signal line is asserted if the first destination operand is equal to a first architectural register, wherein the first 2-to-1 multiplexer outputs the first physical register identifier if the first signal line is asserted.

12. The processor in claim 11 comprising:
a renaming register comprising a plurality of fields, wherein the plurality of fields store a plurality of physical register identifiers, wherein the plurality of physical register identifiers comprise architectural to physical register mappings, wherein a second physical register identifier from architectural to physical register mappings is stored in a first field from the plurality of fields, wherein the second physical register identifier identifies a second physical register allocated to youngest instruction from prior group of instructions with destination operand equal to the first architectural register.

13. The processor in claim 12, wherein one 2-to-1 multiplexer from each circuit of said plurality of circuits is coupled in a chain, wherein a second 2-to-1 multiplexer from the chain is coupled to receive the second physical register identifier, wherein the first 2-to-1 multiplexer is coupled in the chain to receive a third physical register identifier, wherein the first 2-to-1 multiplexer is configured to output the third physical register identifier if the first signal line is not asserted.

14. The processor in claim 13, wherein the first field is coupled to store physical register identifier outputted from a last 2-to-1 multiplexer in the chain.

15. The processor in claim 13, wherein said instructions in the group are from one or more threads, wherein the first decoder is configured to assert the first signal line only if the first instruction belongs to a first thread.

16. The processor in claim 13 comprising:
a plurality of read multiplexers, wherein a first read multiplexer from the plurality of read multiplexers is coupled to receive a first source operand of the first instruction as selection control, wherein the first read multiplexer is coupled to receive the third physical register identifier, wherein the first read multiplexer is configured to output the third physical register identifier if the first source operand is equal to the first architectural register.

17. A method for renaming source operands of instructions comprising:
receiving a group of instructions $I(1), I(2), \ldots, I(n)$;
allocating physical registers to instructions with destination operand;
maintaining a renaming register comprising a plurality of fields, wherein the plurality of fields store a plurality of physical register identifiers, wherein the plurality of physical register identifiers comprise architectural to physical register mappings, wherein a first physical register identifier from architectural to physical register mappings is stored in a first field from the plurality of fields, wherein the first physical register identifier identifies a first physical register allocated to youngest instruction from prior group of instructions with destination operand equal to a first architectural register.

18. The method in claim 17 comprising:
inserting the plurality of physical register identifiers on a plurality of bus lines, wherein the first physical register identifier is inserted on a first bus line from the plurality of bus lines.

19. The method in claim 18, wherein for each instruction $I(i)$ in the group, where $i=1, 2, \ldots, n$, the method comprising:
renaming source operands of instruction $I(i)$, wherein a first source operand of instruction $I(i)$ is renamed to a second physical register identifier that propagates on the first bus line if the first source operand is equal to the first architectural register, wherein the second physical register identifier is allocated to youngest instruction, older than $I(i)$, with destination operand equal to the first architectural register;
if instruction $I(i)$ comprises destination operand equal to the first architectural register:
inserting a third physical register identifier that identifies a third physical register allocated to $I(i)$ on the first bus line.

20. The method in claim 19 comprising:
storing a second plurality of physical register identifiers in the renaming register, wherein the second plurality of physical register identifiers propagate on the plurality of bus lines, wherein a fourth physical register identifier from the second plurality of physical register identifiers propagates on the first bus line, wherein the fourth physical register identifier identifies a fourth physical register allocated to youngest instruction with destination operand equal to the first architectural register, wherein the fourth physical register identifier is stored in the first field.

* * * * *